United States Patent

Wise

[11] Patent Number: 6,066,893
[45] Date of Patent: May 23, 2000

[54] CONTAMINANT RESISTANT BARRIERS TO PREVENT OUTGASSING

[75] Inventor: Rick L. Wise, Plano, Tex.

[73] Assignee: Texas Instruments Incorporated, Dallas, Tex.

[21] Appl. No.: 09/159,039

[22] Filed: Sep. 23, 1998

Related U.S. Application Data

[60] Provisional application No. 60/059,930, Sep. 24, 1997.

[51] Int. Cl.[7] .......................... H01L 23/58; H01L 27/108; H01L 29/76; H01L 29/94; H01L 31/119
[52] U.S. Cl. .......................... 257/751; 257/296; 257/640; 257/649; 257/913
[58] Field of Search ..................................... 257/296, 297, 257/640, 646, 649, 913

[56] References Cited

U.S. PATENT DOCUMENTS

| | | |
|---|---|---|
| 4,060,827 | 11/1977 | Ono et al. . |
| 4,658,282 | 4/1987 | Matzen, Jr. . |
| 5,449,934 | 9/1995 | Shano et al. ............................. 257/295 |
| 5,512,785 | 4/1996 | Haver et al. ............................. 257/758 |
| 5,866,920 | 2/1999 | Matsumoto et al. ...................... 257/63 |

Primary Examiner—Ngân V. Ngô
Attorney, Agent, or Firm—Jaqueline J. Garner; Wade James Brady, III; Frederick J. Telecky, Jr.

[57] ABSTRACT

An integrated circuit comprises a dielectric layer disposed outwardly from a semiconductor substrate, the dielectric layer comprising at least one cavity having sidewalls extending from an outer surface of the dielectric layer inwardly toward the substrate. The integrated circuit further comprises a contaminant resistant barrier disposed outwardly from at least the sidewalls of the cavity in the dielectric layer.

20 Claims, 3 Drawing Sheets

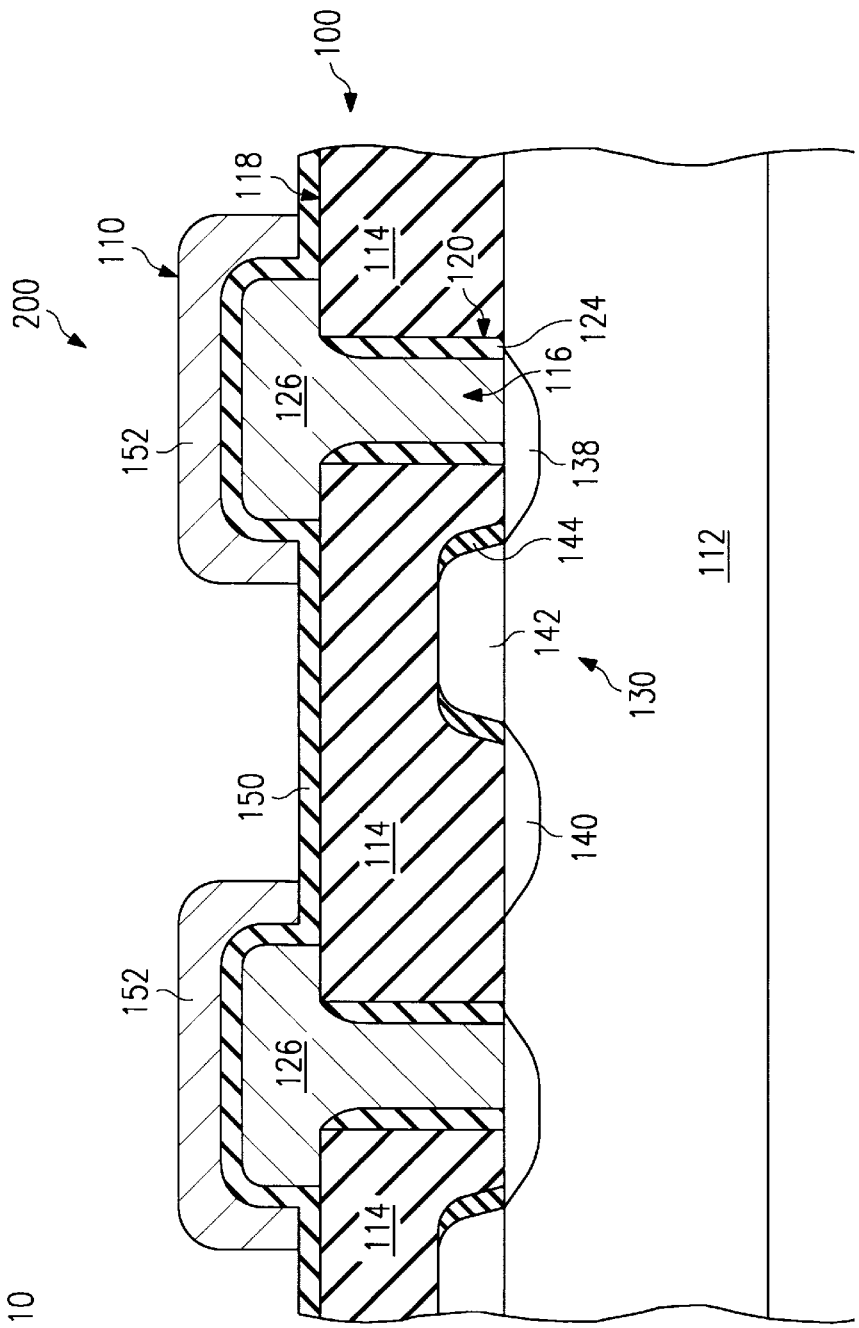
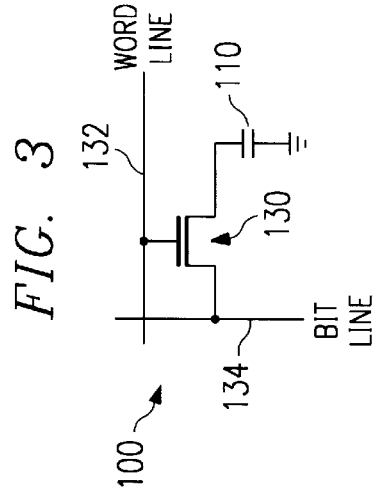
FIG. 3
FIG. 4

CONTAMINANT RESISTANT BARRIERS TO PREVENT OUTGASSING

This application claims priority under 35 USC §119 (e)(1) of provisional application No. 60/059,930, filed Sep. 24, 1997.

TECHNICAL FIELD OF THE INVENTION

This invention relates generally to electronic devices and more particularly to contaminant resistant barriers for preventing outgassing of contaminants from a dielectric.

BACKGROUND OF THE INVENTION

Integrated circuits, particularly those implementing dynamic random access memory cells, often include storage capacitors. The capacitors are often coupled to regions of the semiconductor substrate to provide an electrical connection between the capacitor and other circuit elements. In forming this connection, it is desirable to minimize the resistance between the capacitor and the substrate.

Such capacitors may be formed within cavities or trenches in a dielectric layer disposed outwardly from a semiconductor substrate. During fabrication, the dielectric layer may be subject to elevated temperatures causing moisture and/or contaminants to diffuse from the sidewalls of the cavities. These impurities tend to oxidize the bottom of the cavity on the substrate where the capacitor will ultimately interface with the substrate. This layer of oxide contaminants increases the resistance of the interface.

One approach to removing oxide contaminants from the capacitor/substrate interface to reduce the resistance of this interface is to introduce a substance such as silane to the interface. Silane reduces the oxide, and thus acts to clean the interface. A problem with this approach is that it is generally ineffective in removing more than a monolayer of oxide. Another approach to removing contaminants is to remove impurities from the interface as they are created by performing a high vacuum prebake. In this approach, the interface is subject to a high temperature, such as 850 degrees Celsius, for a period of approximately 60 minutes. A high vacuum removes the contaminants as they volatilize during the prebake. A problem with this approach is that typical thermal budgets of many devices, such as dynamic random access memory cells, cannot withstand the duration of high temperature associated with this approach.

SUMMARY OF THE INVENTION

In accordance with the teachings of the present invention, an integrated circuit is provided that eliminates or substantially reduces problems associated with prior approaches. According to one embodiment of the present invention, an integrated circuit comprises a dielectric layer disposed outwardly from a semiconductor substrate, the dielectric layer comprising at least one cavity having sidewalls extending from an outer surface of the dielectric layer inwardly toward the substrate. The integrated circuit further comprises a contaminant resistant barrier disposed outwardly from at least the sidewalls of the cavity in the dielectric layer.

The present invention has important technical advantages. The contaminant resistant barriers prevent or substantially reduce diffusion of moisture, oxygen and/or contaminants from the sidewalls of the cavities during fabrication. This avoids oxidation of contaminants at the bottom of the cavity, thereby preventing an increase of the resistance of the capacitor/substrate interface. The contaminant resistant barriers also protect the sidewalls of the dielectric layer from being eroded during deglazing of the interface. Utilizing doped polysilicon for the contaminant resistant barriers provides a further advantage of maintaining capacitor contact area, while still preventing outgassing of contaminants. Because the barrier layers prevent outgassing of contaminants in the first place, the invention eliminates the need to subject the device to a high-vacuum prebake to clean the surface of the interface.

BRIEF DESCRIPTION OF THE DRAWINGS

A more complete understanding of the teachings of the present invention may be acquired by referring to the accompanying figures in which like reference numbers indicate like features and wherein;

FIG. 3 is a schematic diagram of an exemplary dynamic random access memory cell; and FIG. 4 is a cross-sectional view of a dynamic random access memory cell constructed according to the teachings of the present invention.

DETAILED DESCRIPTION OF THE INVENTION

Figure 1:
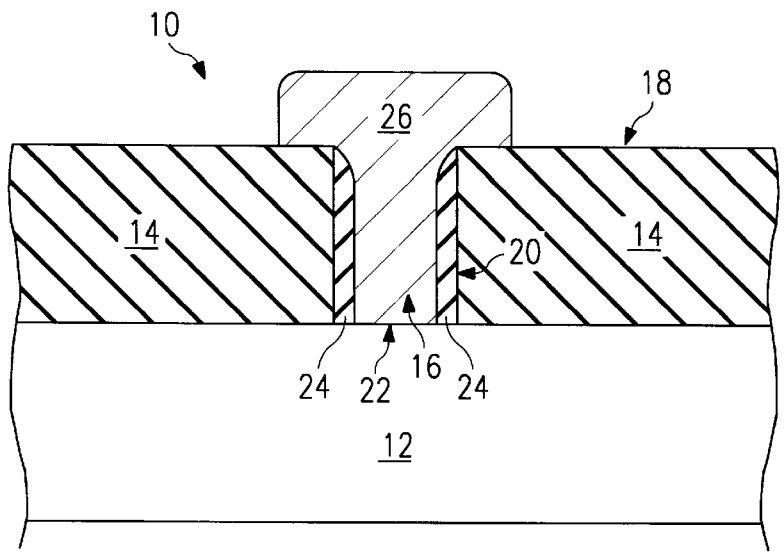
FIG. 1 is a cross-sectional view of a portion of an integrated circuit constructed according to the teachings of the present invention.

FIG. 1 is cross-sectional view of a portion of an integrated circuit constructed according to the teachings of the present invention. Integrated circuit 10 may include a dielectric layer 14 disposed outwardly from a substrate 12. Dielectric layer 14 may comprise any dielectric material or combination of dielectric materials. Dielectric layer 14 may comprise, for example, oxide, nitride or a heterostructure comprising alternate layers of oxide and nitride. Dielectric layer 14 may include one or more cavities 16 extending from an outer surface 18 of dielectric layer 14 inwardly toward substrate 12. Each cavity includes sidewalls 20 and a bottom 22.

Contaminant resistant barriers 24 may be disposed outwardly from at least sidewalls 20 of cavity 16. Contaminant resistant barriers 24 may also reside on portions of outer surface 18 of dielectric layer 14, depending on the fabrication technique used. Contaminant resistant barriers 24 may comprise any non-hygroscopic material suitable to prevent outgassing of moisture and/or contaminants from dielectric layer 14 during device fabrication. Contaminant resistant barrier 24 may comprise, for example, intrinsic polysilicon, doped polysilicon or silicon nitride.

A capacitor contact 26 may be disposed outwardly from dielectric layer 14. At least a portion of capacitor contact 26 may be disposed outwardly from contaminant resistant barriers 24 within cavity 16. Capacitor contact 26 may comprise any conductive material suitable to function as a capacitor contact, such as doped polysilicon. Capacitor contact 26 may comprise a variety of configurations, depending on the desired application. For example, capacitor contact 26 may completely fill cavity 16, or may comprise a conformal layer disposed outwardly from dielectric layer 14.

Figure 2A:
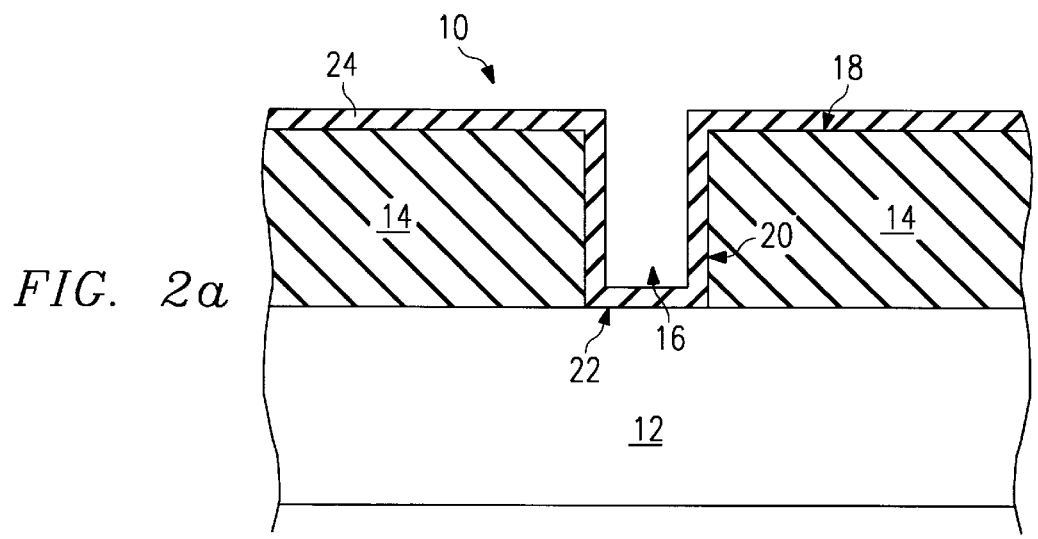
FIGS. 2a–2d are cross-sectional views showing an exemplary method of forming one embodiment of an integrated circuit according to the teachings of the present invention.

FIGS. 2a–2d are cross-sectional views showing an exemplary method of forming a portion of an integrated circuit according to the teachings of the present invention. FIG. 2a shows integrated circuit 10 after the formation of cavity 16 and contaminant resistant barriers 24. Dielectric layer 14 may be formed outwardly from substrate 12 by any appropriate method, such as growing or depositing a dielectric outwardly from the surface of substrate 12. Cavity 16 may be formed, for example, by a pattern and etch of dielectric layer 14. Cavity 16 may extend from outer surface 18 inwardly toward substrate 12, exposing substrate 12 at the bottom 22 of cavity 16. Contaminant resistant barrier 24 may be formed outwardly from dielectric layer 14 by, for example, depositing a non-hygroscopic material outwardly from sidewalls 20 and bottom 22 of cavity 16 and outwardly from outer surface 18 of dielectric layer 14. Contaminant resistant barriers 24 may assume a variety of dimensions. Particular dimensions specified throughout this document are given for exemplary purposes only. Different dimensions of materials may be used without departing from the scope of the invention.

The thickness of contaminant resistant barriers 24 may be adjusted depending on the specific device characteristics desired. On one hand, it is advantageous to make contaminant resistant barriers 24 thick enough to prevent contaminants from outgassing from dielectric layer 14 during device fabrication. At the same time, where contaminant resistant barriers 24 are formed from a non-conductive material, such as silicon nitride, it is advantageous to minimize the thickness of the barriers so as to maximize the area of contact between capacitor contact 26 and substrate 22. Barrier 24 may be formed, for example, by depositing approximately 50–150 Å of silicon nitride outwardly from sidewalls 20 and bottom 22 of cavities 16 and outwardly from outer surface 18 of dielectric layer 14. As described previously, any non-hygroscopic material operable to prevent contaminant outgassing from dielectric layer 14 may be implemented. One alternative to silicon nitride is to form contaminant resistant barriers 24 from doped polysilicon. Doped polysilicon is a conductive non-hygroscopic material. By forming contaminant resistant barriers 24 from a conductive material, such as doped polysilicon, contaminant resistant barriers 24 may form an integral part of capacitor contact 26. As such, contaminant resistant barriers 24 provide an advantage of preventing contaminant outgassing, while maximizing the effective area of capacitor contact 26.

Figure 2B:
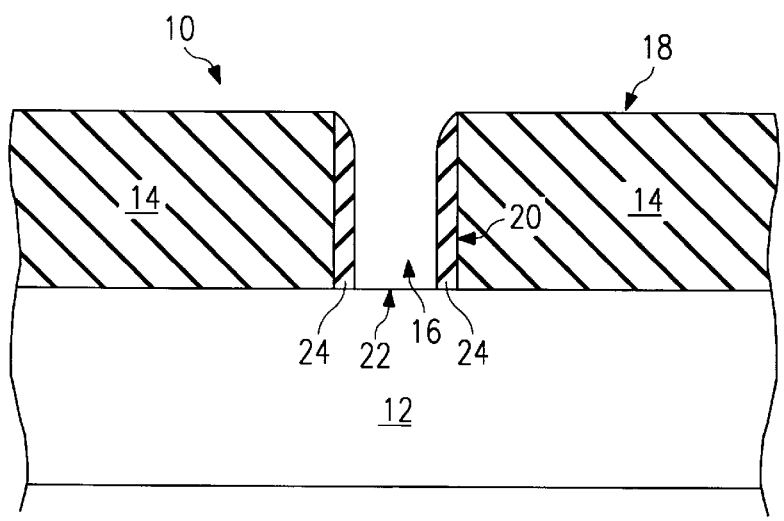

FIG. 2b shows a cross-sectional view of a portion of integrated circuit 10 after a portion of contaminant resistant barrier 24 has been removed. Portions of contaminant resistant barrier 24 may be removed from bottom 22 of cavity 16 by any appropriate method. For example, portions of contaminant resistant barrier 24 may be anisotropically etched from at least bottom 22 of cavity 16, leaving regions of contaminant resistant barrier 24 disposed outwardly from at least sidewalls 20 of cavity 16. In this embodiment, contaminant resistant barrier 24 is removed from outer surface 18 of dielectric layer 14.

In another embodiment (not explicitly shown), contaminant resistant barrier 24 may remain disposed on outer surface 18 of dielectric layer 14 as well as on sidewalls 20 of cavity 16. To facilitate this embodiment, contaminant resistant barrier 24 may be formed such that its thickness outward from outer surface 18 is greater than its thickness within cavity 16. This may be accomplished, for example, by varying the deposition parameters of barrier 24 so that the step coverage is less than 100 percent. In this configuration, contaminant resistant barrier 24 may be removed from bottom 22 of cavity 16, while leaving a portion of contaminant resistant barrier 24 disposed outwardly from outer surface 18 of dielectric layer 14. This configuration provides an advantage of preventing outgassing from both sidewalls 20 and outer surface 18 of dielectric 14 when the device is subject to elevated temperatures during fabrication.

Figure 2C:
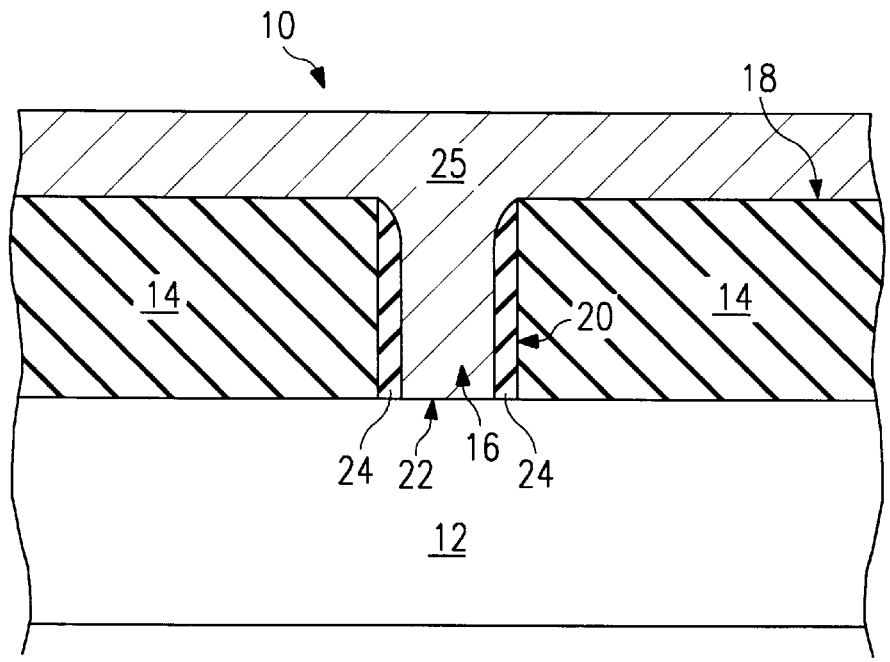

FIG. 2c shows a cross-sectional view of a portion of an integrated circuit 10 after the formation of a capacitor contact layer 25. Capacitor contact layer 25 may be disposed outwardly from dielectric layer 14 and within cavity 16. Capacitor contact layer 25 may ultimately be used to form capacitor contact 26 disposed within cavity 16 of dielectric layer 14. Capacitor contact layer 25 may comprise a variety of configurations depending on the specific application. For example, capacitor contact layer 25 may comprise a solid layer of conductive material which completely fills cavity 16 and overlays dielectric layer 14. Alternatively, capacitor contact layer 25 may comprise a conformal layer of conductive material (not explicitly shown).

Figure 2D:
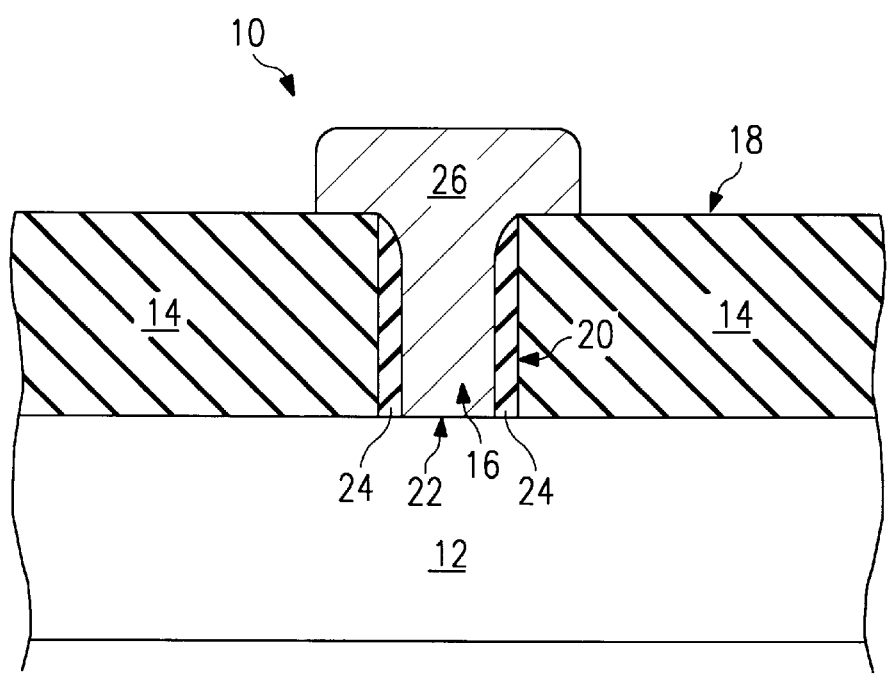

FIG. 2d is a cross-sectional view of a portion of integrated circuit 10 after formation of capacitor contact 26. Capacitor contact 26 may be formed, for example, by patterning and etching capacitor contact layer 25. Capacitor contact 26 may comprise any configuration, such as a plug, a plate, a crown, a finger, etc.

FIG. 3 is a schematic diagram of an exemplary dynamic random access memory cell. A dynamic random access memory cell 100 includes a pass gate transistor 130 coupled to a word line 132 and a bit line 134. A capacitor 110 is also coupled to pass gate transistor 130. In operation, a row decoder (not explicitly shown), selects a particular row by raising the voltage of its word line 132. This causes all the transistors in the selected row to become conductive, thereby connecting the storage capacitors of all the cells in the selected row to their respective bit lines 134. When the transistors of a selected row become conductive, each capacitor 110 is effectively connected in parallel creating a bit line capacitance. In a read operation where capacitor 110 is storing a logic level of 1, the voltage across capacitor 110 causes a positive increment in the bit line capacitance. The change in voltage of the bit line is detected and amplified by a column sense amplifier (not explicitly shown). The amplified signal is then impressed on capacitor 110, thus restoring its signal to the proper level. In this way, all the cells in the selected row are refreshed. Simultaneously, the signal at the output of the sense amplifier of the selected column is fed to the data output line of the chip. The write operation proceeds similarly to the read operation, except that the data bit to be written is applied by the column decoder to a selected bit line. This data bit is stored on capacitor 110 of the selected cell. Simultaneously, all other cells in the selected row are refreshed.

FIG. 4 is a cross-sectional view of an integrated circuit, including a dynamic random access memory cell constructed according to the teachings of the present invention. An integrated circuit 200 may comprise one or more dynamic random access memory cells 100. Dynamic random access memory cell 100 may comprise a pass gate transistor 130 formed in a semiconductor substrate 112. Pass gate transistor 130 may include terminals 138 and 140. Terminals 138 and 140 may comprise a source region 138 and a drain region 140 opposite source region 138. Source region 138 and drain region 140 may be formed in substrate 136. Alternatively, raised source and drain regions may be implemented without departing from the scope of the invention. Pass gate transistor 130 may further comprise a gate 142 disposed between source region 138 and drain region 140, outwardly from substrate 112. Gate 142 may be separated from substrate 112 by a gate dielectric (not explicitly shown). Although one particular type of dynamic random access memory cell has been shown, the invention could also be used for capacitors in dynamic random access memory cells with alternative structure.

Sidewall spacers 144 may be formed outwardly from the sidewalls of gate 142. A dielectric layer 146 may be disposed outwardly from pass gate transistor 130. Dielectric layer 146 may comprise, for example, oxide, nitride, or a heterostructure comprising alternate layers of oxide and nitride. A first capacitor contact layer 126 may be disposed outwardly from dielectric layer 114, and coupled to terminal 138 or 140 pass gate transistor 130. First capacitor contact 114 is similar in structure and function to capacitor contact 26 shown in FIG. 1. First capacitor contact 126 may comprise any conductive material suitable to form a capacitor contact. First capacitor contact 114 may comprise any configuration suitable for a capacitor contact, such as a plate, a crown, a finger, etc. A capacitor dielectric layer 150 may be disposed outwardly from first capacitor contacts 126 and dielectric layer 114. A second capacitor contact layer 162 may be disposed outwardly from first capacitor contact 126 and separated from first capacitor contact 126 by capacitor dielectric layer 150. First and second capacitor contact layers 126 and 152 and capacitor dielectric layer 150 form capacitor 110 in dynamic random access memory cell 100.

Contaminant resistant barriers 124 may be disposed outwardly from sidewalls 120 of cavity 116 in dielectric layer 114. Contaminant resistant barriers 124 are similar in structure and function to contaminant resistant barriers 24 shown in FIG. 1. Contaminant resistant barriers 124 may comprise any non-hygroscopic material suitable to prevent outgassing of moisture and/or contaminants from dielectric layer 114 during fabrication of integrated circuit 200. Contaminant resistant barriers 124 may comprise, for example, intrinsic polysilicon, doped polysilicon, or silicon nitride. Other non-hygroscopic materials may be used without departing from the scope of the invention.

Integrated circuit 200 may be formed in a similar manner to that described in reference to FIGS. 2a–2d. Pass gate transistor 130 may be formed by any appropriate method. Dielectric layer 114 may be disposed outwardly from substrate 112 and pass gate transistor 130. Trenches 116 may be formed in dielectric layer 114 to extend from an outer surface 118 of dielectric layer 114 inwardly toward substrate 112. Cavities 116 may be formed to expose portions of source regions 138. Cavities 116 may be formed by any appropriate method, such as by patterning and etching and/or deglazing portions of dielectric layer 114.

Contaminant resistant barrier 124 may be formed by the method described with reference to FIGS. 2a and 2b. As described above, contaminant resistant barrier 124 may reside only on sidewalls 120 of cavity 116, or alternatively, barrier 124 may also reside on at least a portion of outer surface 118 of dielectric layer 114. Contaminant resistant barrier 124 is anisotropically etched to remove portions of barrier 124 residing on the bottom of cavity 116, and optionally to remove portions of barrier 124 residing on outer surface 118 of dielectric layer 114. In any case, regions of contaminant resistant barrier 124 remain disposed outwardly from sidewalls 120 of cavity 116. Contaminant resistant barrier 124 provides an advantage of preventing outgassing of moisture and/or contaminants during fabrication of the device. First capacitor contacts 126 may be formed in a manner described with reference to FIGS. 2c and 2d. Following formation of first capacitor contacts 126, a capacitor dielectric layer 150 may be disposed outwardly from first capacitor contacts 126 and dielectric layer 114. A second capacitor contact 152 may be disposed outwardly from first capacitor contact 126, and separated from first capacitor contact 126 by capacitor dielectric layer 150. Capacitor contacts 126 and 152, along with capacitor dielectric layer 150 form capacitors 110 in dynamic random access memory cell 100. Various configurations of dynamic random access memory cells may be implemented. The embodiment described here is only one example of a configuration of a dynamic random access memory cell 100. Other configurations may be used without departing from the scope of the invention.

Although the present invention has been described in detail, it should be understood that various changes and substitutions can be made hereto without departing from the spirit and scope of the invention as defined by the appended claims.

What is claimed is:

1. An integrated circuit, comprising:
   a dielectric layer disposed outwardly from a semiconductor substrate, the dielectric layer having at least one cavity having sidewalls extending from an outer surface of the dielectric layer inwardly toward the substrate and a bottom surface; and
   a contaminant resistant barrier disposed outwardly from at least the sidewalls of the cavity in the dielectric layer of sufficient thickness to prevent migration of contaminants from said dielectric layer through said barrier during fabrication of said integrated circuit capable of causing oxidation of the exposed bottom surface of said cavity.

2. The integrated circuit of claim 1, further comprising a capacitor contact, at least a portion of the capacitor contact disposed outwardly from the contaminant resistant barrier within the cavity in the dielectric layer.

3. The integrated circuit of claim 1, wherein the contaminant resistant barrier is disposed outwardly from the sidewalls and an outer surface of the dielectric layer.

4. The integrated circuit of claim 1, wherein the contaminant resistant barrier comprises a material selected from the group consisting of intrinsic polysilicon, doped polysilicon and silicon nitride.

5. The integrated circuit of claim 1, wherein the contaminant resistant barrier comprises approximately between 50 and 150 angstroms of silicon nitride.

6. The integrated circuit of claim 2, wherein the contaminant resistant barrier comprises doped polysilicon and wherein the contaminant resistant barrier forms an integral part of the first capacitor contact.

7. An integrated circuit comprising at least one dynamic random access memory cell, the at least one dynamic random access memory cell comprising:
   a transistor having a terminal;
   a dielectric layer disposed outwardly from a semiconductor substrate and the transistor, the dielectric layer comprising at least one cavity having sidewalls extending from an outer surface of the dielectric layer inwardly toward the substrate;
   a contaminant resistant barrier disposed outwardly from at least the sidewalls of the cavity in the dielectric layer; and
   a first capacitor contact coupled to the terminal of the transistor, at least a portion of the first capacitor contact disposed outwardly from the contaminant resistant barrier within the cavity in the dielectric layer.

8. The integrated circuit of claim 7, wherein the contaminant resistant barrier is disposed outwardly from the sidewalls and an outer surface of the dielectric layer.

9. The integrated circuit of claim 7, wherein the contaminant resistant barrier comprises a material selected from the group consisting of intrinsic polysilicon, doped polysilicon and silicon nitride.

10. The integrated circuit of claim 7, wherein the contaminant resistant barrier comprises approximately between 50 and 150 angstroms of silicon nitride.

11. The integrated circuit of claim 7, wherein the contaminant resistant barrier comprises doped polysilicon and wherein the contaminant resistant barrier forms an integral part of the first capacitor contact.

12. A method of making an integrated circuit comprising:

forming a dielectric layer disposed outwardly from a semiconductor substrate;

forming at least one cavity in the dielectric layer, the cavity having sidewalls extending from an outer surface of the dielectric layer inwardly toward the substrate, and a bottom; and forming a contaminant resistant barrier disposed outwardly from at least the sidewalls of the cavity in the dielectric layer of sufficient thickness to prevent migration of contaminants from said dielectric layer through said barrier during fabrication of said integrated circuit capable of causing oxidation of the exposed bottom of said cavity.

13. The method of claim 12, wherein forming a contaminant resistant barrier comprises:

depositing the contaminant resistant barrier outwardly from the dielectric layer; and anisotropically etching at least a portion of the contaminant resistant barrier from the bottom of the cavity, leaving at least a portion of the contaminant resistant barrier disposed outwardly from the sidewalls of the cavity.

14. The method of claim 12, further comprising forming a first capacitor contact, at least a portion of the first capacitor contact disposed outwardly from the contaminant resistant barrier within the cavity in the dielectric layer.

15. The method of claim 12, wherein forming the contaminant resistant barrier comprises:

depositing the contaminant resistant barrier outwardly from the dielectric layer so that the thickness of the contaminant resistant barrier disposed outwardly from the outer surface of the dielectric layer is greater than the thickness of the contaminant resistant barrier disposed outwardly from the bottom of the cavity; and anisotropically etching at least a portion of the contaminant resistant barrier from the bottom of the cavity, leaving at least a portion of the contaminant resistant barrier disposed outwardly from the outer surface and the sidewalls of the dielectric layer.

16. The method of claim 12, wherein the step of forming the contaminant resistant barrier comprises the step of depositing silicon outwardly from at least the sidewalls of the cavity in the dielectric layer.

17. The method of claim 12, wherein the step of forming the contaminant resistant barrier comprises the step of depositing intrinsic polysilicon outwardly from at least the sidewalls of the cavity in the dielectric layer.

18. The method of claim 12, wherein the step of forming the contaminant resistant barrier comprises the step of depositing doped polysilicon outwardly from at least the sidewalls of the cavity in the dielectric layer.

19. The method of claim 12, wherein forming the contaminant resistant barrier comprises depositing silicon nitride outwardly from at least the sidewalls of the cavity in the dielectric layer.

20. The method of claim 12, wherein forming the contaminant resistant barrier comprises depositing approximately between 50 and 150 angstroms of silicon nitride outwardly from at least the sidewalls of the cavity in the dielectric layer.

* * * * *